United States Patent
Katou et al.

(10) Patent No.: US 8,229,520 B2
(45) Date of Patent: Jul. 24, 2012

(54) COVER PART FOR ELECTRONIC EQUIPMENT AND ELECTRONIC EQUIPMENT HAVING THE SAME

(75) Inventors: Yoshiaki Katou, Kawasaki (JP); Takashi Kojima, Kawasaki (JP); Kazunori Katou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 576 days.

(21) Appl. No.: 12/358,896

(22) Filed: Jan. 23, 2009

(65) Prior Publication Data

US 2009/0207570 A1 Aug. 20, 2009

(30) Foreign Application Priority Data

Feb. 14, 2008 (JP) ................................. 2008-032562

(51) Int. Cl.
*H04M 1/00* (2006.01)

(52) U.S. Cl. ................. 455/575.1; 455/90.3; 455/550.1; 455/575.8

(58) Field of Classification Search ............... 455/575.1, 455/550.1, 575.3, 575.4, 575.8, 90.3, 128, 455/344, 346, 347, 349; 379/428.01, 430, 379/433.11, 434, 440, 441; D14/137, 138, D14/248, 250; 345/87, 905
See application file for complete search history.

(56) References Cited

U.S. PATENT DOCUMENTS

| | | | | |
|---|---|---|---|---|
| 6,341,227 B1* | 1/2002 | Moster et al. | ............... | 455/550.1 |
| 6,904,300 B1* | 6/2005 | Maattanen et al. | ........ | 455/575.1 |
| 6,914,995 B2* | 7/2005 | Kao | ............... | 381/370 |
| 7,113,812 B2* | 9/2006 | Li | ............... | 455/575.1 |
| 7,409,225 B2* | 8/2008 | Kim et al. | ............... | 455/558 |
| 7,577,465 B2* | 8/2009 | Cheng et al. | ............... | 455/575.2 |
| 7,577,468 B2* | 8/2009 | Begic et al. | ............... | 455/575.8 |
| 7,885,058 B2* | 2/2011 | Li et al. | ............... | 361/679.01 |
| 7,953,371 B2* | 5/2011 | Lee et al. | ............... | 455/41.2 |
| 2002/0193082 A1* | 12/2002 | Uemura et al. | ............... | 455/90 |
| 2002/0197965 A1* | 12/2002 | Peng | ............... | 455/90 |
| 2005/0049015 A1* | 3/2005 | Wang | ............... | 455/575.1 |
| 2006/0121963 A1* | 6/2006 | Gartrell et al. | ............... | 455/575.8 |
| 2006/0293080 A1* | 12/2006 | Cho | ............... | 455/556.1 |
| 2007/0021159 A1* | 1/2007 | Kaneoya | ............... | 455/575.3 |
| 2008/0139258 A1* | 6/2008 | Park et al. | ............... | 455/575.1 |
| 2009/0191927 A1* | 7/2009 | Hong | ............... | 455/575.8 |
| 2010/0203929 A1* | 8/2010 | Skagmo et al. | ............... | 455/575.1 |
| 2011/0151823 A1* | 6/2011 | Yang | ............... | 455/347 |

FOREIGN PATENT DOCUMENTS

| | | |
|---|---|---|
| JP | 2004-234861 | 8/2004 |
| JP | 2006-109061 | 4/2006 |
| JP | 2006-135638 | 5/2006 |

OTHER PUBLICATIONS

Japanese Patent Office Action mailed Feb. 21, 2012 for corresponding Japanese Patent Application No. 2008-032562.

\* cited by examiner

*Primary Examiner* — Pablo Tran
(74) *Attorney, Agent, or Firm* — Staas & Halsey LLP

(57) ABSTRACT

A cover part of an electronic equipment that exposes or closes a portion of the electronic equipment with which an electronic part is connected, including a housing external appearance constituent portion that constitutes a part of an external appearance surface of a housing of the electronic equipment. An inner mount lid portion fixed to the housing external appearance constituent portion and a housing fixing member sandwiched between the housing external appearance constituent portion and the inner mount lid portion are provided, where the housing external appearance constituent portion and the inner mount lid portion are formed of a constituent material different from a constituent material of the housing fixing member.

6 Claims, 5 Drawing Sheets

COVER PART FOR ELECTRONIC EQUIPMENT AND ELECTRONIC EQUIPMENT HAVING THE SAME

CROSS-REFERENCE TO RELATED APPLICATIONS

This application is based upon and claims the benefit of priority of the prior Japanese patent application no. 2008-032562, filed on Feb. 14, 2008, the entire contents of which are incorporated herein by reference.

FIELD

The present invention relates to a cover part for an electronic equipment and an electronic equipment having the cover part. More specifically, the present invention relates to a cover part provided at a portion of an electronic equipment, such as a portable information terminal or the like, with which an electronic part is connected, and the electronic equipment having the cover part.

BACKGROUND

Recently, an information communication terminal such as a cellular phone or the like is provided with a terminal at the side portion thereof so that an electronic part such as a Secure Digital card, an AC adapter or the like is connected to the information communication terminal through the terminal. The terminal is covered by a cover part to prevent invasion of duct, etc. from the external under the state that the information communication terminal is not used.

A bendable rubber type resin such as elastomer, silicon rubber or the like is used as the material of a cover part 10 of conventional electronic equipment. A housing fixing portion 1 of the cover part 10 is secured to a portion at which a terminal of a cellular phone or the like is provided, and the cover part 10 is engagedly fitted in the housing of the cellular phone, whereby dust, etc. are prevented from invading from the external.

Under the state that the cover part 10 is engagedly fitted in the housing of the cellular phone, plastic resin such as acrylonitrile butadiene styrene resin, polycarbonate/acrylonitrile butadiene styrene resin or the like is coated on a housing external appearance surface constituent portion 2 which constitutes a part of the external appearance surface of the housing.

Specifically, the cover part 10 is formed by a dabble molding method (two-color molding method) in which different kinds of materials are formed by the same metal mold. That is, molding is conducted by using rubber type resin, and the housing external appearance surface constituent portion 2 of the plastic resin is formed integrally with a molded article formed of the rubber type resin in the same metal mold.

The resin constituting the housing external appearance surface constituent portion 2 is the same as the material constituting the external appearance of the housing of the cellular phone and the material constituting the housing external appearance surface constituent portion 2 of the cover part 10 is coincident with the material constituting the housing of the cellular phone. Accordingly, when the cover part 10 is engagedly fitted in the housing of the cellular phone, the housing and the cover part 10 are integrated with each other on the external appearance design.

The Japanese Laid-open Patent Publication No. 2006-135638 discloses a cellular phone having an earphone microphone terminal and an earphone microphone terminal cover covering the earphone microphone terminal. In this cellular phone, a knob portion of the earphone microphone terminal cover is formed of hard resin, a lid portion is formed of soft resin and the knob portion and the lid portion are exposed to the outside.

In the above dabble molding method, the plastic resin is coated on only the external appearance surface of the cover part 10, and when the plastic resin is coated, a masking step is executed. Accordingly, jigs used in the masking step may be complicated, and thus it is difficult to suppress the manufacturing cost of the cover part 10 to a low value.

Furthermore, in the process of manufacturing the cover part 10 of rubber type resin, if plastic resin adheres to a portion on which the plastic resin should not be coated, a step of exfoliating the coating compositions and a cleaning step are executed. Accordingly, the number of steps in the process of manufacturing the cover part 10 increases, and there is a risk that a secondary trouble may be induced. Furthermore, it is necessary to clean or exchange the jigs used for the coating every time the cover part is manufactured, and thus it is difficult to suppress the manufacturing cost of the cover part 10 to a low value.

SUMMARY

A cover part for an electronic equipment is provided that can prevent invasion (entry) of dust, etc., into the electronic equipment, and an electronic equipment having the cover part.

According to an embodiment, a cover part for an electronic equipment is provided that can implement a structure adaptable to enhancement of design performance of the electronic equipment with low cost, and an electronic equipment having the cover part.

According to an embodiment, a cover part of an electronic equipment that exposes or closes a portion of the electronic equipment with which an electronic part is connected is provided. The cover part includes a housing external appearance constituent portion that constitutes a part of an external appearance surface of a housing of the electronic equipment, an inner mount lid portion fixed to the housing external appearance constituent portion, and a housing fixing member sandwiched between the housing external appearance constituent portion and the inner mount lid portion, where the housing external appearance constituent portion and the inner mount lid portion are formed of a constituent material different from a constituent material of the housing fixing member.

The object(s) and advantage(s) of the invention will be realized by the elements and combination(s) particularly pointed out in the claims.

It is to be understood that both the foregoing general description and the following detailed description are exemplary and are not restrictive of the invention, as claimed.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which.

DESCRIPTION OF EMBODIMENTS

Figure 1A:
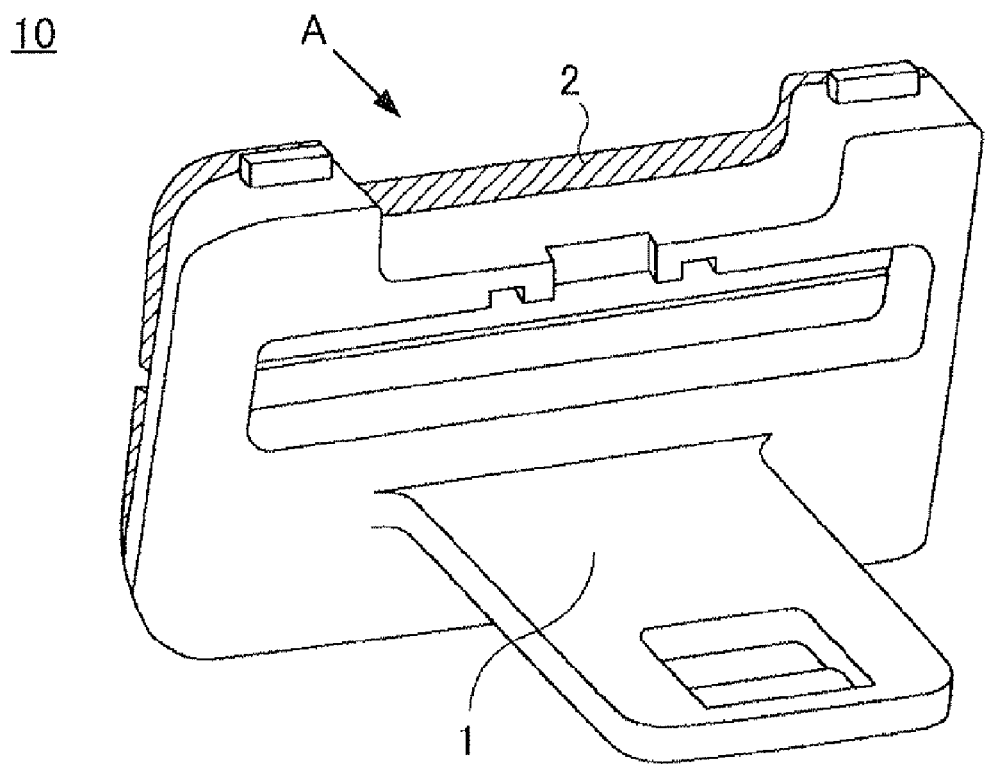
FIG. 1A is a perspective view showing a cover part for a conventional electronic equipment.
Figure 1B:
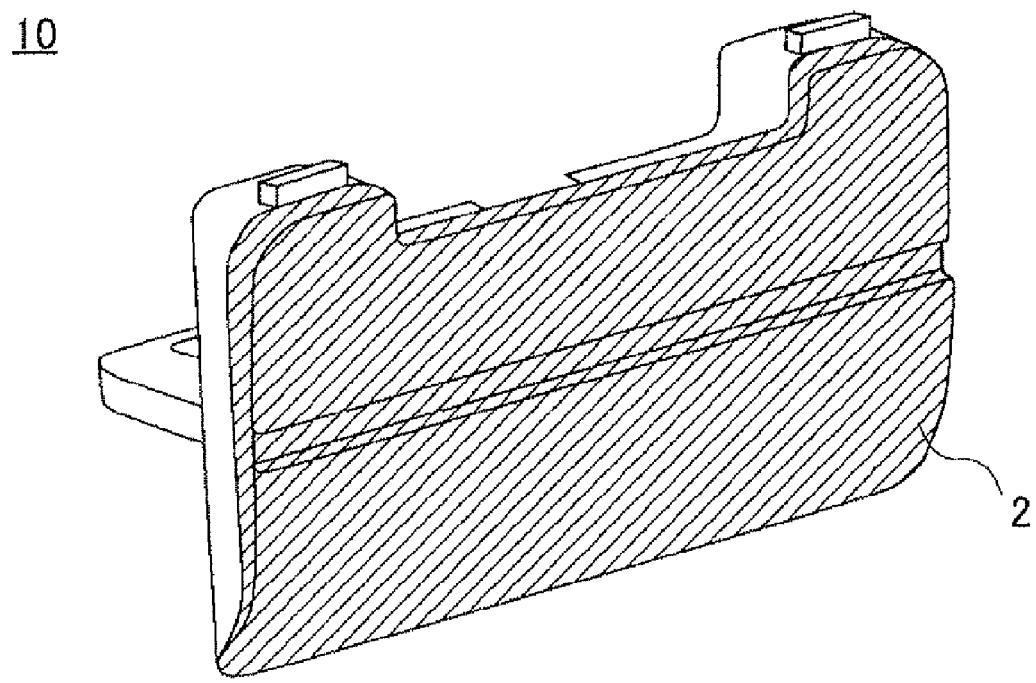
FIG. 1B is a view showing the cover part which is taken in a direction of an arrow A of FIG. 1A.

Reference will now be made in detail to the embodiments, examples of which are illustrated in the accompanying drawings, wherein like reference numerals refer to the like elements throughout. The embodiments are described below to explain the present invention by referring to the figures.

Embodiments of a cover part for an electronic equipment and an electronic equipment having a cover part will be described with reference to the accompanying drawings. The following description will be made on the assumption that a cellular phone is used as an example of an electronic equipment, however, the embodiment(s) may be applied to other types of information communication terminals each of which is provided with a cover part, and other kinds of electronic equipment.

Figure 2A:
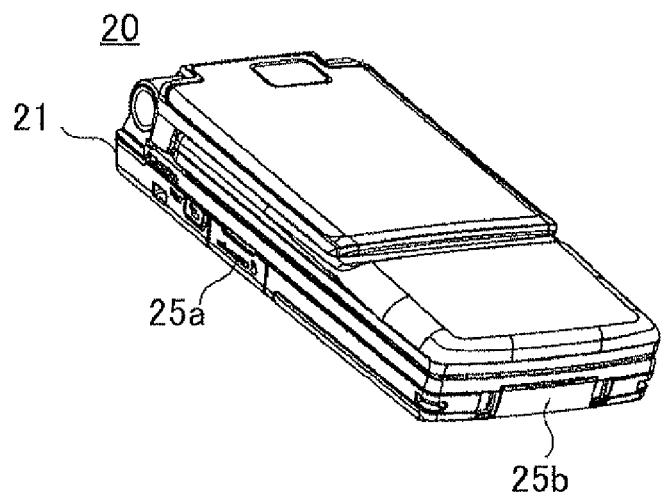
FIG. 2A is a diagram showing a cellular phone according to an embodiment.
Figure 2B:
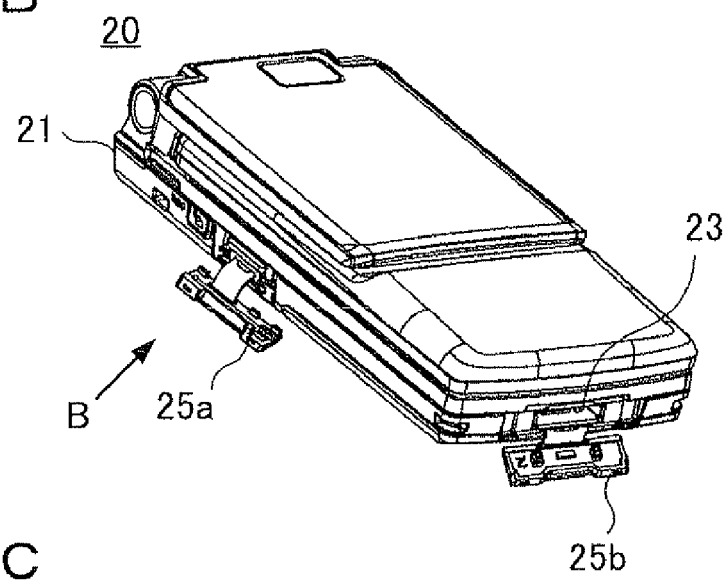
FIG. 2B is a diagram showing a state that a cover part provided to a housing of the cellular phone shown in FIG. 2A is opened.
Figure 2C:
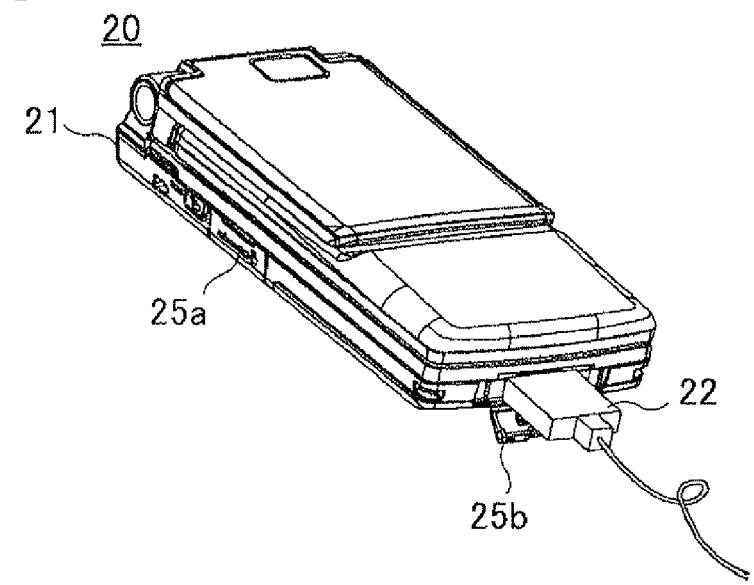
FIG. 2C is a diagram showing a state that an AC adapter is connected with a terminal exposed to an outside when a cover part is opened.

FIG. 2A is a diagram showing a cellular phone according to an embodiment. FIG. 2B is a diagram showing a state that a cover part provided to a housing of a cellular phone shown in FIG. 2A is opened. FIG. 2C is a diagram showing a state that an AC adapter is connected with a terminal exposed to an outside when the cover part is opened.

As shown in FIG. 2A, a cellular phone 20 is a so-called folding (flip) type of a cellular phone. Generally, the folding type cellular phone is provided with a display at a turn side thereof and with various kinds of operating keys at the non-turn side thereof. While FIGS. 2A through 2C are explained using a cellular phone of a certain type and specific element(s) attachable and/or readable by the cellular phone as an example, the present invention is not limited to a particular type electronic equipment.

A first cover part 25a and a second cover part 25b are engagedly fitted in a side surface of a housing 21 of the cellular phone 20. For example, a Secure Digital card and an insertion port of an earphone jack are exposed and hidden by the first cover part 25a. The Secure Digital card is inserted into the cellular phone 20 in a direction of an arrow B in FIG. 2B. A portion at which a terminal 23 connected to the AC adapter 22 is provided is exposed and hidden by the second cover part 25b shown in FIG. 2C.

The first cover part 25a and the second cover part 25b will be described. The first cover part 25a and the second cover part 25b will be described as the cover part 25 with reference to FIGS. 3A, 3B, 4A and 4B.

Figure 3A:
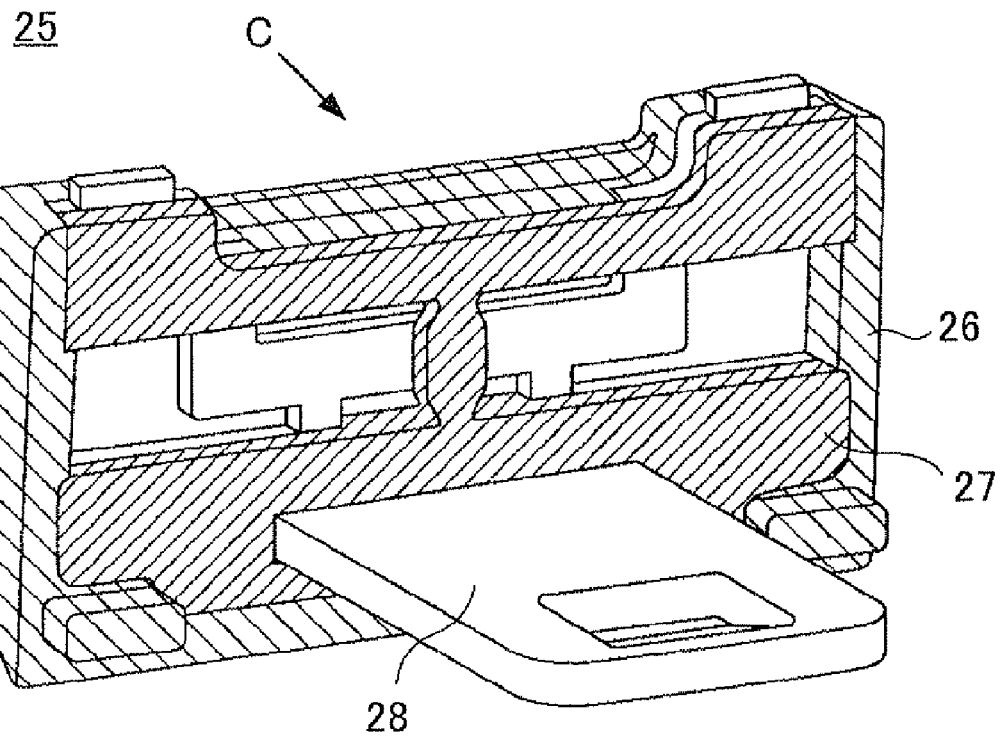
FIG. 3A is a perspective view showing a cover part.
Figure 3B:
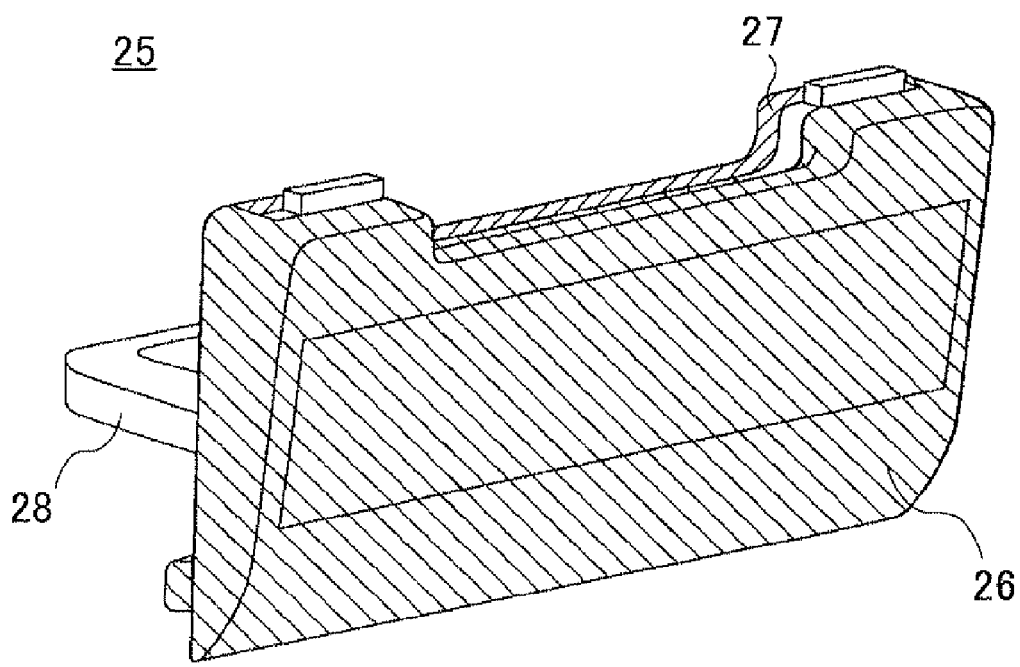
FIG. 3B is a diagram showing a cover part which is taken in a direction of an arrow C of FIG. 3A.

FIG. 3A is a perspective view showing a cover part 25 shown in FIG. 1A. FIG. 3B is a diagram showing a cover part which is taken in a direction of an arrow C of FIG. 3A.

The cover part 25 shown in FIG. 3A has a housing external appearance surface constituent portion 26 which constitutes a part of an external appearance surface of the housing 21 of the cellular phone 20, an inner mount lid portion 27 fixed onto a surface of the housing external appearance surface constituent portion 26 which is located inside the cellular phone 20 when the cover part 25 is engagedly fitted in the housing 21 of the cellular phone 20, and a housing fixing member 28 sandwiched between the housing external appearance surface constituent portion 26 and the inner mount lid portion 27.

Figure 4A:
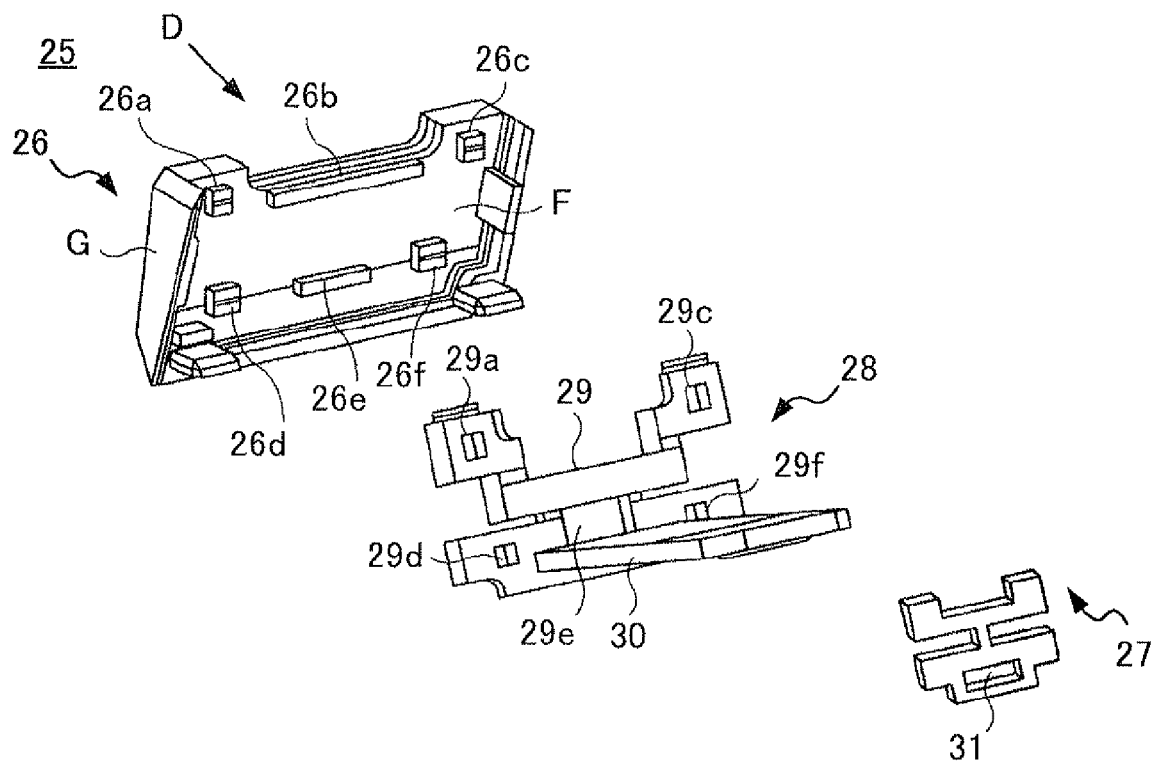
FIG. 4A is an exploded perspective view showing a cover part shown in FIG. 3A.
Figure 4B:
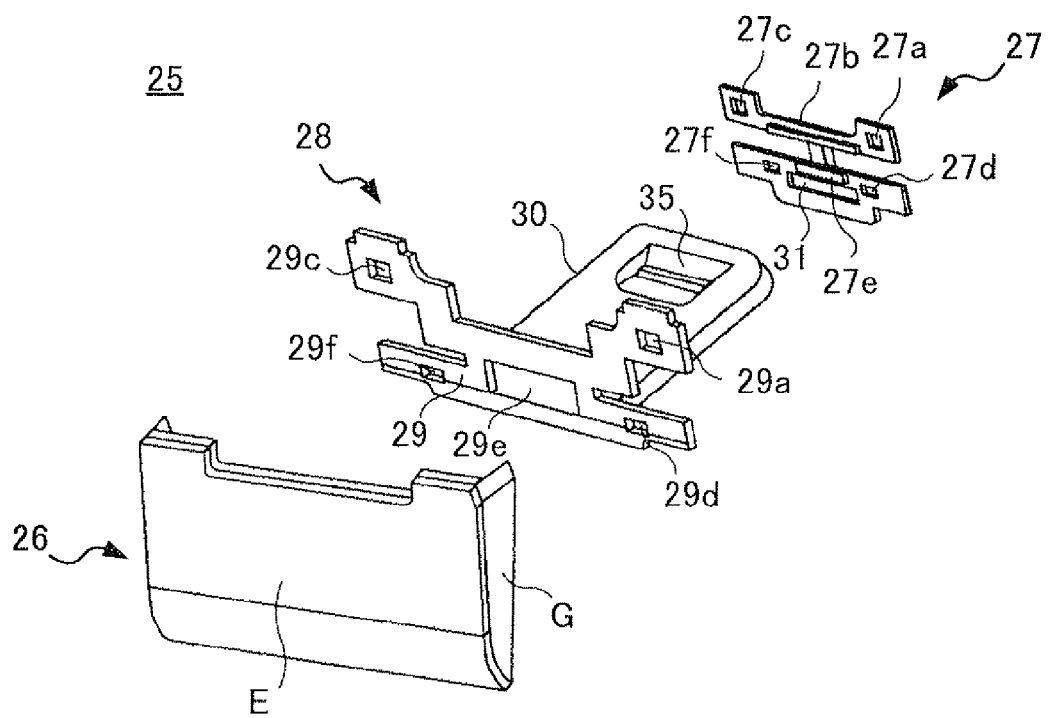
FIG. 4B is a diagram showing a cover part which is taken in a direction of an arrow D of FIG. 4A.

FIG. 4A is an exploded perspective view showing the cover part 25 shown in FIG. 3A. FIG. 4B is a diagram showing the cover part 25 of FIG. 4A which is taken in a direction of an arrow D of FIG. 4A.

The housing external appearance surface constituent portion 26 shown in FIG. 4A has an outer surface E constituting a part of the external appearance surface of the housing 21 of the cellular phone 20, and an inner surface F located inside the cellular phone 20 when the cover part 25 is engagedly fitted in the housing 21. Longitudinal surfaces G are formed at two confronting sides of the inner surface F so as to extend in a direction perpendicular to the inner surface F.

The housing external appearance surface constituent portion 26 may be formed of the same material as the external appearance of the housing 21 of the cellular phone 20. For example, plastic resin such as acrylonitrile butadiene styrene resin, polycarbonate/acrylonitrile butadiene styrene resin or the like is used as the material of the housing external appearance surface constituent portion 26.

The material constituting the housing external appearance surface constituent portion 26 is coincident with the material constituting the external appearance of the housing 21 of the cellular phone 20. Therefore, when the cover part 25 is engagedly fitted in the housing 21, the outer surface E of the cover part 25 is integral with the external appearance surface of the housing 21 in design.

As shown in FIG. 4A, plural ribs 26a to 26f are formed on the inner surface F of the housing external appearance surface constituent portion 26 so as to extend from the inner surface F in a direction perpendicular to the inner surface F. For example, the number of the plural ribs is equal to six in FIG. 4A.

Bendable rubber type resin such as elastomer, silicone rubber or the like is used as the material of the housing fixing member 28 provided on the inner surface F of the housing external appearance surface constituent portion 26.

The housing fixing member 28 has a main body portion 29 which is located on the inner surface F when the housing fixing member 28 is provided on the inner surface F of the housing external appearance surface constituent portion 26, and a housing fixing portion 30 which is formed so as to extend from the main body portion 29 in a direction perpendicular to the main body portion 29.

Through holes 29a and 29c to 29f are formed in the main body portion 29 of the housing fixing member 28 so as to be positionally confronted (correspond) to the ribs 26a and 26c to 26f formed on the inner surface F of the housing external appearance surface constituent surface 26. The depths of the through holes 29a and 29c to 29f are set to be slightly shorter than the heights of the ribs 26a and 26c to 26f formed on the inner surface F of the housing external appearance surface constituent portion 26. Accordingly, when the housing fixing member 28 is provided on the inner surface F of the housing external appearance surface constituent portion 26, the ribs 26a and 26c to 26f of the housing external appearance surface constituent portion 26 which are inserted in the through holes 29a and 29c to 29f are slightly projected from the through holes 29a and 29c to 29f.

A through hole 35 (FIG. 4B) is formed in the main surface of the housing fixing portion 30 of the housing fixing member 28. The housing fixing portion 30 is secured to the portion at which the terminal 23 provided in the cellular phone 20 is provided. When the cover part 25 is about to be drawn out from the housing 21, the through hole 35 concerned is hooked to a hook portion in the housing 21, whereby the cover part 25 is prevented from being perfectly separated from the housing 21.

The inner mount lid portion 27 is provided on the main body portion 29 of the housing fixing member 28. The inner mount lid portion 27 is formed of the same material as the housing external appearance surface constituent portion 26. For example, the material of the inner mount lid portion 27 is plastic resin such as acrylonitrile butadiene styrene resin, polycarbonate/acrylonitrile butadiene styrene resin or the like.

A through hole 31 is formed in the main surface of the inner mount lid portion 27 having a substantially H-shape so as to face a formation position of the housing fixing portion 30 of the housing fixing member 28. Accordingly, when the inner mount lid portion 27 is provided on the main body portion 29 of the housing fixing member 28, the housing fixing portion 30 of the housing fixing member 28 is inserted into the through hole 31.

When the inner mount lid portion 27 is mounted on the main body portion 29 of the housing fixing member 28, recess portions 27a, 27c, 27d and 27f are formed on the inner mount lid portion 27 at positions corresponding to the formation positions of the ribs 26a, 26c, 26d and 26f of the housing external appearance surface constituent portion 26 so as to extend in a vertical direction. Ribs 27b and 27e are formed at the positions corresponding to the formation positions of the ribs 26b and 26e so as to extend in a vertical direction.

When the inner mount lid portion 27 is provided through the housing fixing member 28 onto the inner surface F of the housing external appearance surface constituent portion 26, the ribs 26a, 26c, 26d and 26f of the housing external appearance surface constituent portion 26 come into contact with the recess portions 27a, 27c, 27d and 27f of the inner mount lid portion 27 through the through holes 29a, 29c, 29d and 29f formed in the housing fixing member 28. The rib 26b of the housing external appearance surface constituent portion 26 comes into contact with the rib 27b. The rib 26e of the housing external appearance surface constituent portion 26 comes into contact with the rib 27e of the inner mount lid portion 27 through the through hole 29e formed in the housing fixing member 28.

In the cover part 25 of an embodiment, the ribs 26a, 26c, 26d and 26f are connected and fixed to the recess portions 27a, 27c, 27d and 27f of the inner mount lid portion 27 by an ultrasonic welding technique, and the rib 26b of the housing external appearance surface constituent portion 26 is connected and fixed to the rib 27b of the inner mount lid portion 27 by the ultrasonic welding technique. Furthermore, the rib 26e of the housing external appearance surface constituent portion 26 and the rib 27e of the inner mount lid portion 27 are connected and fixed to each other by the ultrasonic welding technique. Accordingly, the housing fixing member 28 is sandwiched between the housing external appearance surface constituent portion 26 and the inner mount lid portion 27, and this sandwich state is kept.

When the portion at which the terminal 23 is provided is covered by the cover part 25, invasion (entry) of dust, etc. into the inside of the cellular phone 20 containing the terminal 23, etc. can be prevented.

Since the material of the housing external appearance surface constituent portion 26 of the cover part 25 is coincident with the material constituting the external appearance of the housing 21 of the cellular phone 20, the outer surface E of the cover part 25 is integral with the external appearance surface of the housing 21 on design when the cover part 25 is engagedly fitted in the cellular phone 20, so that the design performance of the cellular phone 20 can be enhanced.

The cover part 25 has the following and other advantages compared with the conventional cover part 10.

That is, in the embodiment using the dabble molding method, the masking operation of coating plastic resin on only the external appearance surface of the cover part 10 is executed, and thus jigs used in the masking operation may be complicated. In the case of the cover part 10 shown in FIG. 1A, when coating compound of the plastic resin adheres to a place at which the plastic resin should not be coated, exfoliation operation of the coating compound and the cleaning operation are executed.

In the cover part 25 of an embodiment, a constituent material of the housing external appearance surface constituent portion 26 and the inner mount lid portion 27 is different from a constituent material of the housing fixing member 28. Accordingly, the housing external appearance surface constituent portion 26 and the inner mount lid portion 27 are formed by a different metal mold from that of the housing fixing member 28, and these elements are not formed by a simple metal mold. Accordingly, the cover part 25 of this embodiment does not require the processing of masking or the like, and also does not require any complicated jig, so that the cover part 25 can be manufactured at low cost. Furthermore, the cover part 25 of an embodiment having independent and different material can suppress decrease of the yield which is caused by occurrence of defectives or the like, and thus the workability can be enhanced.

Furthermore, the cover part 25 comprises separate and independent parts such as the housing external appearance surface constituent portion 26, the inner mount lid portion 27 and the housing fixing member 28. Therefore, the change of the shapes of these parts and the maintenance of the metal molds for forming the parts can be separately and individually performed, so that the manufacturing plan can be easily established/changed.

In the above embodiment, the inner mount lid portion 27 is formed of the same constituent material as the housing external appearance surface constituent portion 26, however, this is merely an example. For example, both the elements may be formed of different materials. However, when the constituent material of the inner mount lid portion 27 is identical to that of the housing external appearance surface constituting portion 26, the ribs 26a, 26c, 26d and 26f of the housing external appearance surface constituent portion 26 and the recess portions 27a, 27c, 27d and 27f of the inner mount lid portion 27 can be surely welded to one another by ultrasonic welding, the rib 26b of the housing external appearance surface constituent portion 26 and the rib 27b of the inner mount lid portion 27 can be surely welded to each other by ultrasonic welding, and the state that the housing fixing member 28 is sandwiched between the housing external appearance surface constituent portion 26 and the inner mount lid portion 27 can be surely kept.

The state that the cover part 25 is engagedly fitted in the cellular phone 20 will be described with reference to FIG. 5.

Figure 5:
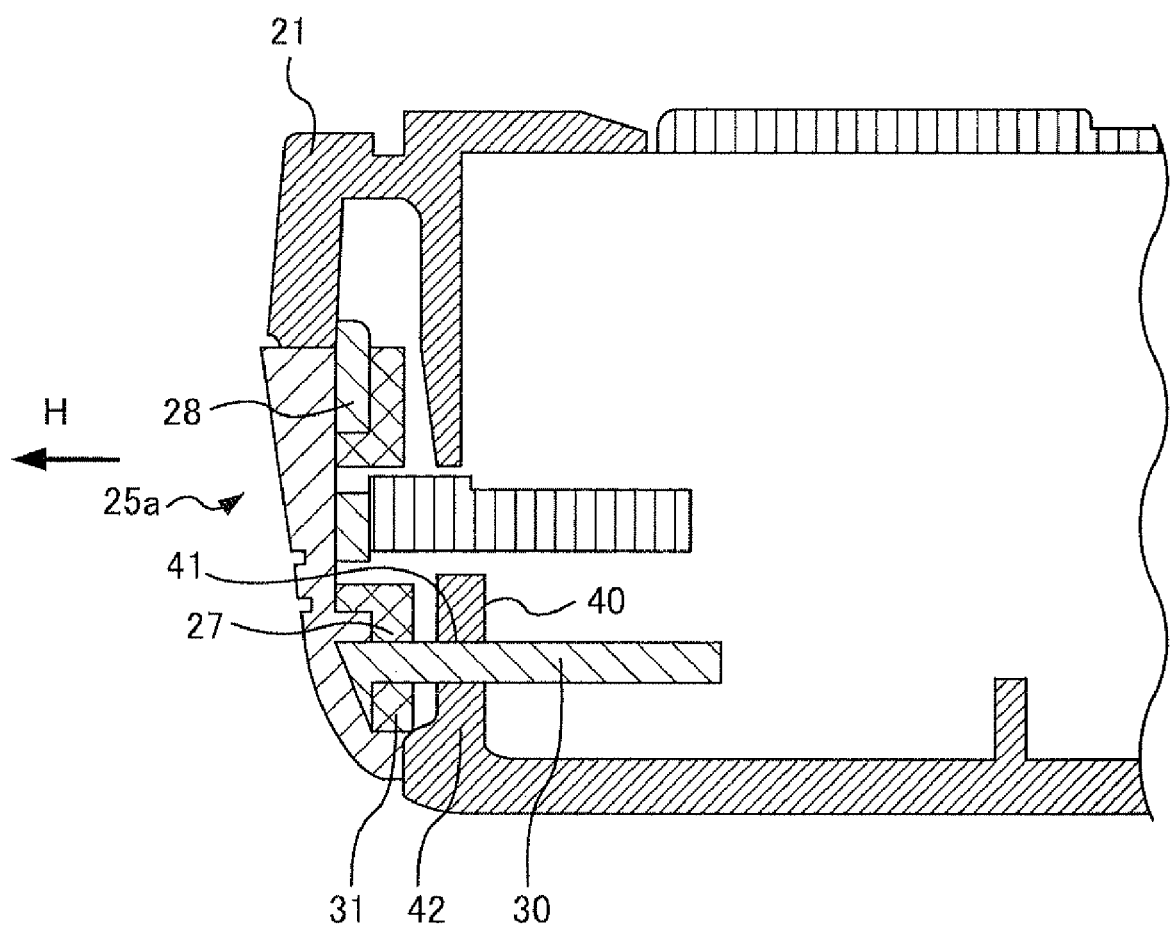
FIG. 5 is a partially cross-sectional view showing a state that a first cover part shown in FIGS. 3A and 4A is engagedly fitted in the cellular phone.

FIG. 5 is a partially cross-sectional view showing a state that a first cover part 25a shown in FIGS. 3A and 4A is engagedly fitted in the cellular phone. In order to make the drawings easily viewable, the parts provided inside the housing 21 are omitted from the illustration of FIG. 5.

As shown in FIG. 5, the cover part 25a, in which the housing fixing member 28 is pinched by the housing external appearance surface constituting portion 26 and the inner mount lid portion 27 are fixed to each other by the ultrasonic welding technique, is engagedly fitted in the side surface of the housing 21 of the cellular phone 20.

A wall portion 40 is vertically formed in the housing 21, and an opening portion 41 is formed in the wall portion 40 so as to be located at the corresponding position to the formation position of the housing fixing portion 30 of the housing fixing member 28. Under the state that the cover part 25a is engagedly fitted in the side surface of the housing 21 of the cellular phone 20, a part of the housing fixing portion 30 which is located at the main body portion 29 side is located in the opening portion 41.

In order to connect a secure digital card, an earphone jack or the like to the cellular phone 20, the cover part 25a is drawn out from the housing 21 in a direction as indicted by an arrow H in FIG. 5.

When the housing fixing portion 30 is drawn out, the tip of the through hole 35 (FIG. 4B) formed in the main surface of the housing fixing portion 30 intrudes into the hook portion 42 constituting the lower-side outer peripheral portion of the opening portion 41 and is hooked to the hook portion 42, so that the cover part 25 can be prevented from being perfectly separated from the housing 21. This state is shown in FIG. 2B. Under this state, the terminal to which the secure digital card or the earphone jack is to be connected is exposed to the outside, and thus the secure digital card or the earphone jack can be connected to the terminal.

The state that the first cover part 25a is engagedly fitted in the cellular phone 20 is shown in FIG. 5, and this engaged fit-in structure is also applicable to the second cover part 25b.

All examples and conditional language recited herein for pedagogical purposes to aid the reader in understanding the principles of the invention and the concepts contributed by the inventor to furthering the art, and are to be construed as being without limitation to such specifically recited examples and conditions, nor does the organization of such example in the specification relate to a showing of the superiority and inferiority of the invention. Although a few embodiments of the present invention have been described and shown in detail, it should be understood that the various changes, substitutions, and alterations could be made hereto without departing from the sprit and the principles of the invention, the scope of which is defined in the claims and their equivalents.

What is claimed is:

1. A cover part for an electronic equipment that exposes or closes a portion of the electronic equipment with which an electronic part is connected, comprising:
    a housing external appearance constituent portion that constitutes a part of an external appearance surface of a housing of the electronic equipment;
    an inner mount lid portion fixed to the housing external appearance constituent portion; and
    a housing fixing member sandwiched between the housing external appearance constituent portion and the inner mount lid portion, and
    wherein the housing external appearance constituent portion and the inner mount lid portion are formed of a constituent material different from a constituent material of the housing fixing member.

2. The cover part for the electronic equipment according to claim 1, wherein the housing external appearance constituent portion is formed of the same constituent material as the housing of the electronic equipment.

3. The cover part for the electronic equipment according to claim 1, wherein the housing external appearance constituent portion and the inner mount lid portion are formed of the same material.

4. The cover part for the electronic equipment according to claim 1, wherein the material of the housing external appearance constituent portion contains plastic resin.

5. The cover part for the electronic equipment according to claim 1, wherein the material of the housing fixing member contains rubber type resin.

6. Electronic equipment having a housing and a cover part that is engagedly fitted in a portion of the housing with which an electronic part is connected, comprising:
    a housing external appearance constituent portion constituting a part of an external appearance surface of the housing;
    an inner mount lid portion fixed to the housing external appearance constituent portion; and
    a housing fixing member that is sandwiched between the housing external appearance constituent portion and the inner mount lid portion and secured to the inside of the electronic equipment, and
    wherein the housing external appearance constituent portion and the inner mount lid portion are formed of a material different from a constituent material of the housing fixing member.

* * * * *